United States Patent
Rick

(10) Patent No.: US 12,222,319 B2
(45) Date of Patent: Feb. 11, 2025

(54) REPEATED CYCLES SQUARE WAVE VOLTAMMETRY

(71) Applicant: Hach Company, Loveland, CO (US)

(72) Inventor: David Langley Rick, Longmont, CO (US)

(73) Assignee: HACH COMPANY, Loveland, CO (US)

( * ) Notice: Subject to any disclaimer, the term of this patent is extended or adjusted under 35 U.S.C. 154(b) by 326 days.

(21) Appl. No.: 17/698,263

(22) Filed: Mar. 18, 2022

(65) Prior Publication Data

US 2023/0296560 A1  Sep. 21, 2023

(51) Int. Cl.
*G01N 27/48* (2006.01)
*G01R 19/02* (2006.01)

(52) U.S. Cl.
CPC ............ *G01N 27/48* (2013.01); *G01R 19/02* (2013.01)

(58) Field of Classification Search
CPC .............................. G01N 27/48; G01N 27/327
See application file for complete search history.

(56) References Cited

U.S. PATENT DOCUMENTS

| | | |
|---|---|---|
| 2020/0400610 A1 | 12/2020 | Rajasekharan et al. |
| 2021/0341418 A1 | 11/2021 | Salzer et al. |

OTHER PUBLICATIONS

Dr. Steve Arar, "FIR Filter Design by Windowing: Concepts and the Rectangular Window," May 12, 2016, downloaded from the website All About Circuits on Apr. 1, 2024—https://www.allaboutcircuits.com/technical-articles/finite-impulse-response-filter-design-by-windowing-part-i-concepts-and-rect/ (Year: 2016).*
Economou et al., "Digital filtering in stripping analysis," Analytica Chimica Acta 305 (1995) 165-175 (Year: 1995).*
De Souza et al., "Multiple square wave voltammetry for analytical determination of paraquat in natural water, food, and beverages using microelectrodes," Talanta 69 (2006) 1200-1207 (Year: 2006).*
Krulic et al., "Multiple square wave voltammetry experimental verification of the theory," J. Electroanal. Chem. 287 (1990) 225-227 (Year: 1990).*
Baranski, A , et al., "Fourier transform square-wave voltammetry", Journal of Electroanalytical Chemistry and Interfacial Electrochemistry, Elsevier, Amsterdam, NL, vol. 373, No. 1-2, Aug. 8, 1994 (Aug. 8, 1994), pp. 157-165, 157-165.
Fatouros, N , et al., "Theory of multiple Square wave voltammetries", Journal of Electroanalytical Chemistry and Interfacial Electrochemistry, Elsevier, Amsterdam, NL, vol. 213, No. 1, Nov. 10, 1986 (Nov. 10, 1986), pp. 1-16.

* cited by examiner

*Primary Examiner* — Alexander S Noguerola
(74) *Attorney, Agent, or Firm* — Ference & Associates LLC

(57) ABSTRACT

An embodiment provides a method for measuring a component of an aqueous sample using square wave voltammetry, including: introducing the aqueous sample to a chamber of a square wave voltammetry apparatus; applying a stimulus voltage step to the aqueous sample, wherein the stimulus voltage comprises a staircase voltage, wherein each step of the staircase voltage defines a group and comprises two or more repeated square wave modulations of equal voltage amplitude; measuring a resultant current output resulting from the stimulus voltage, wherein the measuring comprises square wave voltammetry; and averaging the resultant current output across at least two or more cycles of each group. Other aspects are described and claimed.

17 Claims, 11 Drawing Sheets

REPEATED CYCLES SQUARE WAVE VOLTAMMETRY

FIELD

This application relates generally to measurement of a species in solution based on square wave voltammetry, and, more particularly, to voltammetry using repeated cycles in an aqueous sample.

BACKGROUND

Voltammetry is a class of techniques used in electro-chemical measurement. It may involve applying a variable voltage between two electrodes in solution and recording a resulting current response, often measured at a third electrode. The resulting response current versus applied voltage curve yields useful information about the fluid sample being measured. A typical voltammogram exhibits one or more quasi-Gaussian response peaks in which the peak position is related to the redox potential of a chemical species in the solution being analyzed.

BRIEF SUMMARY

In summary, one embodiment provides a method for measuring a component of an aqueous sample using square wave voltammetry, comprising: introducing the aqueous sample to a chamber of a square wave voltammetry apparatus; applying a stimulus voltage step to the aqueous sample, wherein the stimulus voltage comprises a staircase voltage, wherein each step of the staircase voltage defines a group and comprises two or more repeated square wave modulations of equal voltage amplitude; measuring a resultant current output resulting from the stimulus voltage, wherein the measuring comprises square wave voltammetry; and averaging the resultant current output across at least two or more cycles of each group.

Another embodiment provides a device for measuring a component of an aqueous sample using square wave voltammetry, comprising: a voltammetric electrode; at least one reference electrode; at least one counter electrode; and a memory storing instructions executable by a processor to: apply a stimulus voltage step to the aqueous sample, wherein the stimulus voltage comprises a staircase voltage, wherein each step of the staircase voltage defines a group and comprises two or more repeated square wave modulations of equal voltage amplitude; measure a resultant current output resulting from the stimulus voltage, wherein the measuring comprises square wave voltammetry; and average the resultant current output across at least two or more cycles of each group.

A further embodiment provides a system for measuring a component of an aqueous sample using square wave voltammetry, comprising: a voltammetric electrode; at least one reference electrode; at least one counter electrode; and a storage device having code stored therewith, the code being executable by the processor and comprising: code that applies a stimulus voltage step to the aqueous sample, wherein the stimulus voltage comprises a staircase voltage, wherein each step of the staircase voltage defines a group and comprises two or more repeated square wave modulations of equal voltage amplitude; code that measures a resultant current output resulting from the stimulus voltage, wherein the measuring comprises square wave voltammetry; and code that averages the resultant current output across at least two or more cycles of each group.

The foregoing is a summary and thus may contain simplifications, generalizations, and omissions of detail; consequently, those skilled in the art will appreciate that the summary is illustrative only and is not intended to be in any way limiting.

For a better understanding of the embodiments, together with other and further features and advantages thereof, reference is made to the following description, taken in conjunction with the accompanying drawings. The scope of the invention will be pointed out in the appended claims.

DETAILED DESCRIPTION

Figure 1:
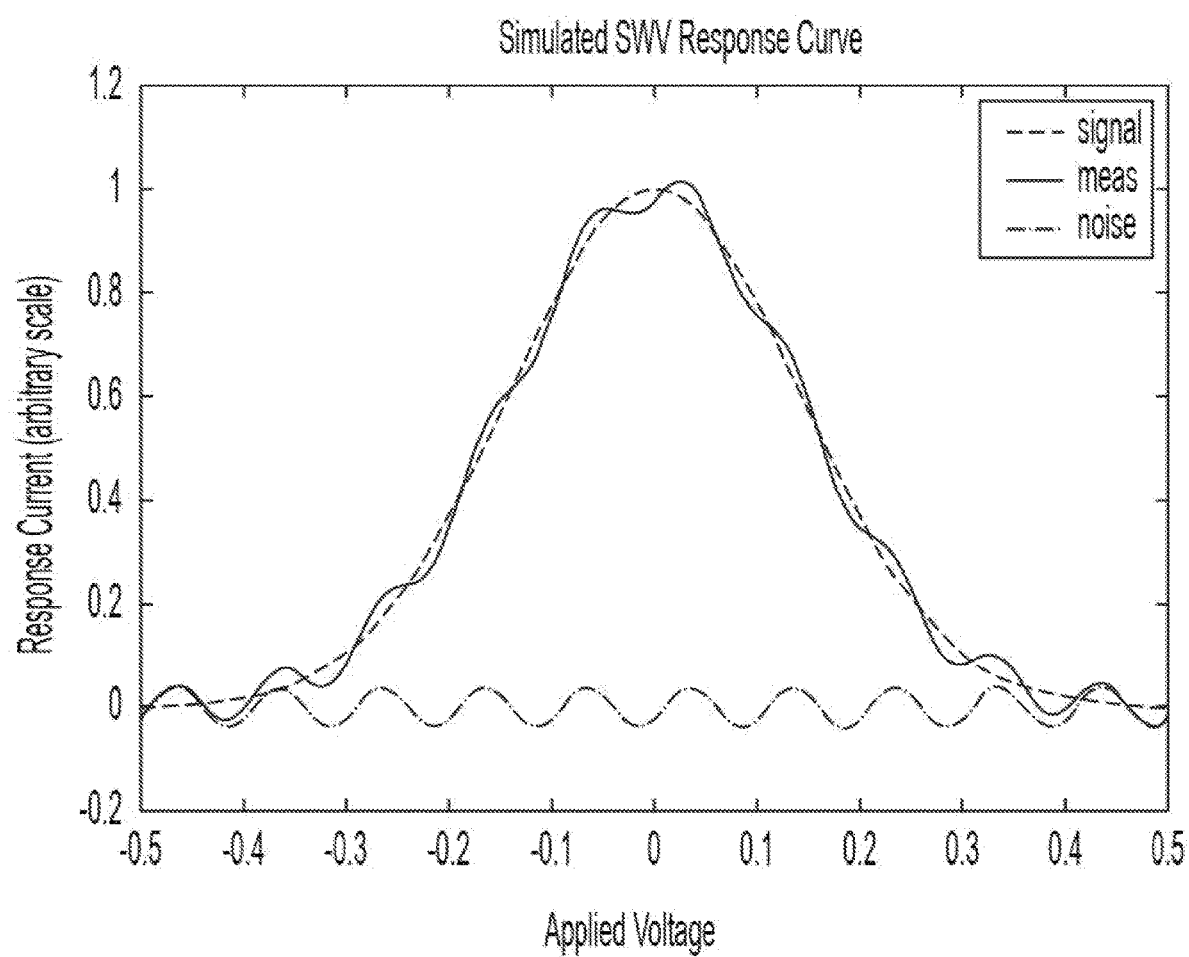
FIG. 1 illustrates an example simulation of the effect of alternating current line interference on a square wave voltage measurement. The example sweep illustrates 101 ramp steps spanning −0.5V to +0.5V, with $f_{mod}$=500 Hz and $f_{line}$=50 Hz.

It will be readily understood that the components of the embodiments, as generally described and illustrated in the figures herein, may be arranged and designed in a wide variety of different configurations in addition to the described example embodiments. Thus, the following more detailed description of the example embodiments, as represented in the figures, is not intended to limit the scope of the embodiments, as claimed, but is merely representative of example embodiments.

Reference throughout this specification to "one embodiment" or "an embodiment" (or the like) means that a particular feature, structure, or characteristic described in connection with the embodiment is included in at least one} embodiment. Thus, appearances of the phrases "in one embodiment" or "in an embodiment" or the like in various places throughout this specification are not necessarily all referring to the same embodiment.

Furthermore, the described features, structures, or characteristics may be combined in any suitable manner in one or more embodiments. In the following description, numerous specific details are provided to give a thorough understanding of embodiments. One skilled in the relevant art will recognize, however, that the various embodiments can be practiced without one or more of the specific details, or with other methods, components, materials, et cetera. In other instances, well-known structures, materials, or operations are not shown or described in detail. The following description is intended only by way of example, and simply illustrates certain example embodiments.

A variety of voltage waveforms may be used in voltammetry experiments. Many commonly used stimulus waveforms involve step changes in voltage. Square Wave Voltammetry (SWV) may superimpose a square-wave modulation on top of a voltage ramp. In SWV instruments of modern manufacture, the "ramp" may typically comprise a series of small-amplitude voltage steps resembling a staircase. The modulation amplitude is typically tens of millivolts, but lower or higher amplitudes may be used. The modulation amplitude is distinct from the amplitude of the ramp steps upon which it imposed. In SWV, the height of each step may be only a few millivolts; in contrast Staircase Voltammetry (SCV) traverses the desired voltage range in a few larger steps. Instruments performing SWV scans commonly capture the current responses to the positive- and negative-going parts of the square wave modulation separately. Typically, the latter is subtracted from the former to cancel a "background" response current. Many other stimulus waveforms involving step changes may be imagined and employed.

Accordingly, the systems and methods described herein provide a technique for an enhancement of conventional SWV. It may be referred to as Repeated Cycle Square Wave Voltammetry (RCSWV). While this is the preferred embodiment, the ideas described are not limited solely to SWV, they may be applied to any stimulus waveform containing a series of periodic edge transitions where the periodicity is preferably chosen in relation to the power line frequency. For example, in laboratory environments, shielded enclosures may reduce power line interference problems. A conflict arises, though, if SWV measurements are to be applied in heavy industrial or field measurement applications. Difficult venues or locations often preclude the careful laboratory practice and shielded enclosures used in laboratory settings. Consequently, the range of available SWV setups must be restricted in order to reject interference from AC power lines.

Voltage steps may cause time-varying response currents. There is an initial surge of current at the time of the step due to capacitive charging of the double-layer electrochemical capacitor at the electrode-fluid interface. This capacitive charging current decays exponentially. As the capacitive charging current dies away, a second current component dominates. This so-called Faradaic current is a consequence of ion diffusion and its amplitude depends on the applied stimulus voltage in comparison to the activation potentials of the reactions occurring near the electrode-fluid interface. This dependency is the basis upon which fluid samples are commonly characterized.

It should be noted that Faradaic current also varies over time: it is highest immediately after a step transition and decays from that initial value towards a lower asymptotic value that depends on the diffusion rate of the reactive specie(s) and the electrode size and geometry. Many conventional instruments integrate some portion of this decay curve and report a single value associated with each square-wave half-cycle or step.

The differential response currents involved are typically small, nanoamps to microamps, so these measurements are easily contaminated by interference from nearby AC (alternating current) power lines. If the integration scheme of a SCV instrument is known, it may be possible to adjust the instrument settings to make the integration period equal to one or more full cycles of the power line frequency. In the case of Square Wave Voltammetry, a different strategy may be used. The modulation frequency may be chosen to place the positive and negative half cycle transitions an integral number of power line cycles apart. If this is done, then the inference contribution to each will be similar and will be removed when the half-cycle responses are differenced. This works irrespective of the of the integration scheme used by the instrument. Skilled users of conventional SWV instruments may choose the square wave modulation frequency to achieve this result.

The illustrated example embodiments will be best understood by reference to the figures. The following description is intended only by way of example, and simply illustrates certain example embodiments.

Referring to FIG. 1, in an embodiment, a potential effect of power line interference, illustrates an idealized SWV response plot with and without additive AC noise. In this example the AC interference has moved the response peak by 30 mV. If this experiment were being used to measure a Nernstian pH response, this would result in an error of more than 0.5 pH.

In laboratory environments, careful wiring and use of shielded enclosures may reduce power line interference problems. In that event, the step rate or square modulation frequency can be regarded as free parameters which the experimenter may adjust for optimal results. A conflict arises, though, if SWV measurements are to be applied in heavy industrial or field measurement applications. Such difficult venues or locations often preclude the careful laboratory practice and shielded enclosures used in laboratory settings. Consequently, the range SWV setups must be severely limited in order to reject interference from AC power lines.

Square wave modulation frequency may be chosen in fixed relation to the frequency of the AC power grid to reduce sensitive SWV measurements be corrupted by induced line noise. Likewise, in SCV mode, the length of each acquisition window is ideally equal to a fixed multiple of the AC line period. Consequently, step duration or modulation frequency are no longer free parameters, but are constrained to a discrete set of values. For conventional SWV to reject power line interference, the chosen modulation frequency must be one-half of the power line frequency or some integer sub-multiple thereof. Higher modulation frequencies cannot be used without compromising AC line immunity.

The restrictions noted above may become a burdensome limitation when studying certain classes of surface-bound reactions in which the reactive species are exhausted very quickly. A knowledgeable and skilled laboratory analyst may program a potentiostat with a fast enough modulation frequency that the current responses can be measured before they decay. But in the presence of line-related interference, this cannot be done without compromising the measurement integrity.

Figure 2:
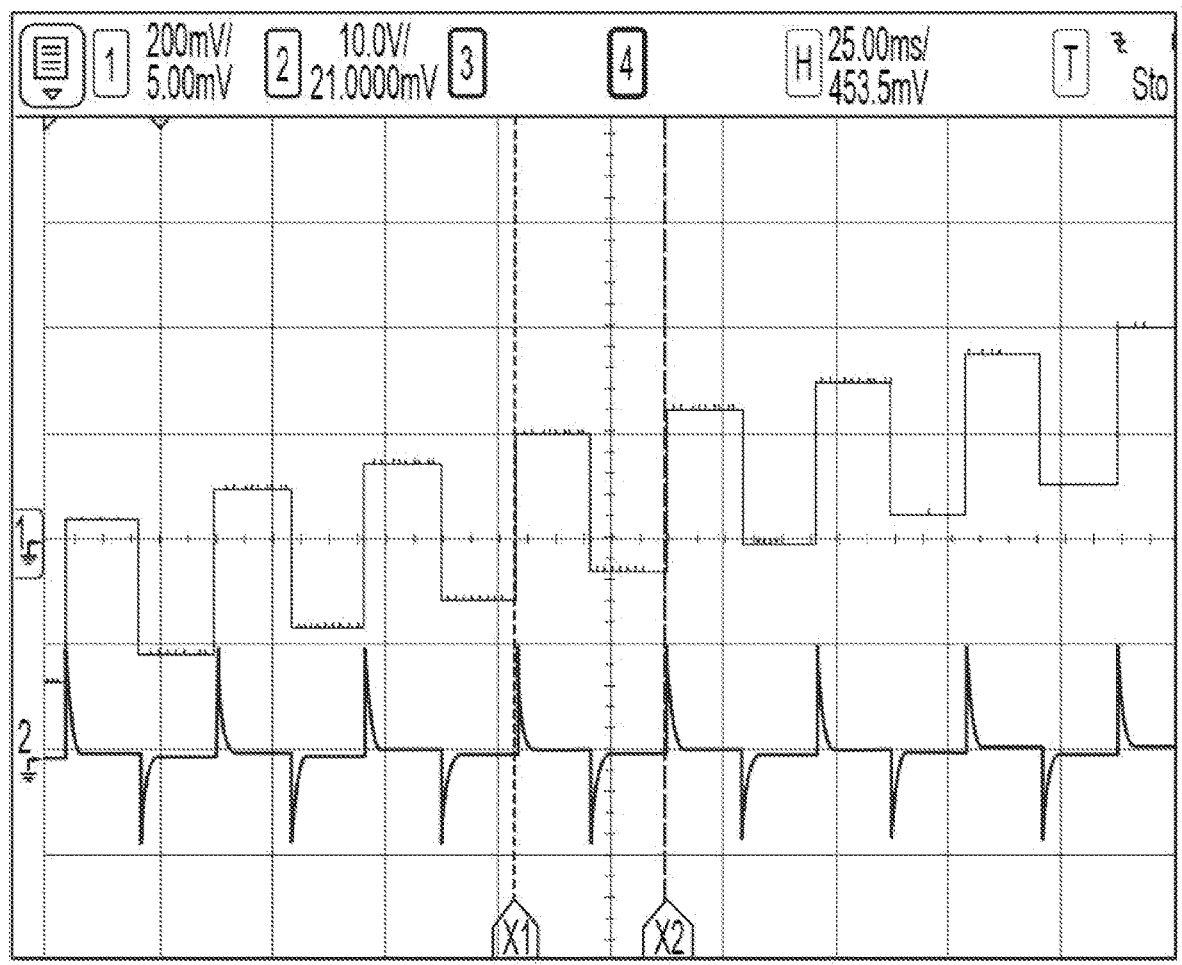
FIG. 2 illustrates an example oscilloscope capture of a stimulus voltage (top) and a response current (bottom) for square wave voltage. Cursors labelled X1 and X2 may span an even integer number of power line cycles.
Figure 3:
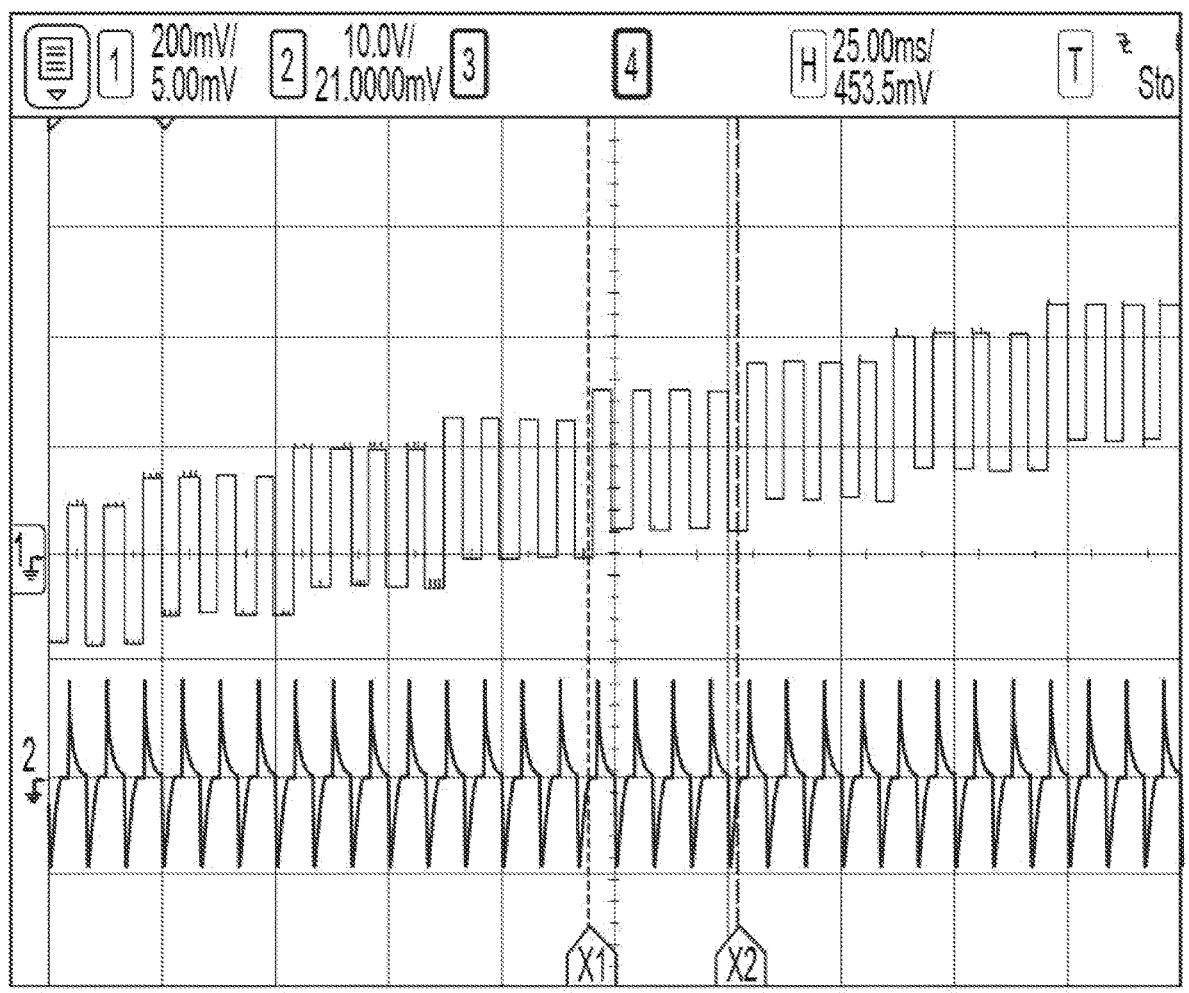
FIG. 3 illustrates an example oscilloscope capture of a stimulus voltage (top) and a response current (bottom) for repeated cycle square wave voltage. Cursors labelled X1 and X2 may span an even integer number of power line cycles.

In Repeated Cycle Square Wave Voltammetry, each single cycle of a conventional SWV voltage excitation may be replaced by an integer number, r, of shorter cycles such that the total duration of these repeated cycles is equal to the period of the original single cycle, ideally an even integer number, k, of power line cycles. This is illustrated in FIG. 2 and FIG. 3. Referring to FIG. 2, in an embodiment, the top oscilloscope trace illustrates the stimulus waveform for a conventional SWV measurement and the top trace in FIG. 3 shows the corresponding RCSWV waveform according to this disclosure. By comparing the time cursors X1 and X2, it will be noted that a single square wave cycle of conventional SWV is replaced by several shorter square wave cycles in Repeated Cycle SWV. The time interval bounded by X1 and X2 is preferably chosen to facilitate AC line rejection.

In a preferred embodiment, the square wave and power line frequencies are related according to:

$$k \cdot f_{mod} = r \cdot f_{line} \quad (1)$$

In this equation, $f_{mod}$ denotes the square wave modulation frequency, $f_{line}$ the local power line frequency (typically 50 or 60 Hz), r is the number of repeated square waves per ramp voltage value, and k is an integer number of power line periods within which these repeats fit exactly. Power line frequency varies among regions or countries, and parameters may be adjusted for the location of use.

In an embodiment, the reported current response for each stimulus ramp voltage is obtained by averaging the constituent square wave responses. This averaging may be done either before or after the SWV differencing operation. In one embodiment, the cycle responses are combined with uniform weighting, but other embodiments may employ non-uniformly weighted averaging.

The option to perform non-uniform averaging of responses across each group of repeated square wave cycles is a novel and valuable aspect of this disclosure. It provides additional freedom in the measurement setup which a skilled instrument designer or analytical practitioner can use to improve the robustness of measurements.

Figure 4:
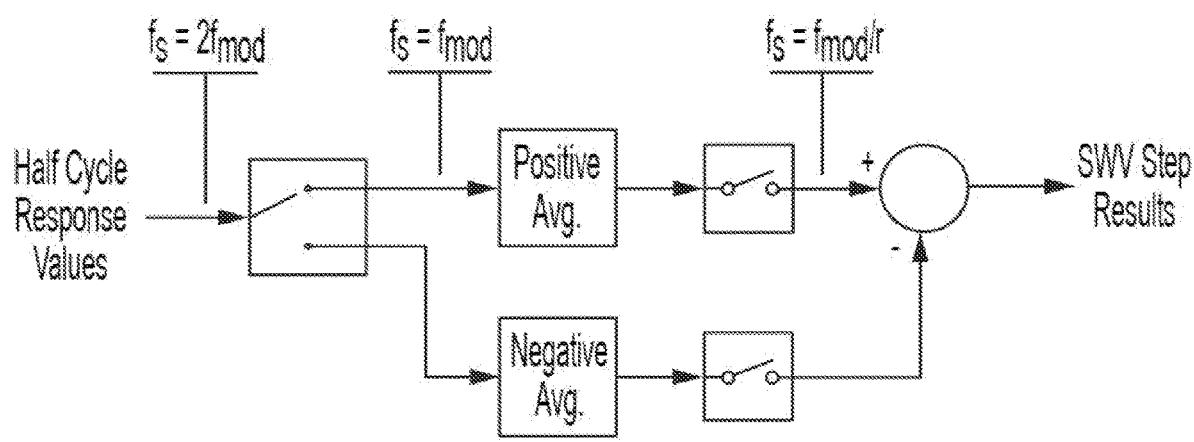
FIG. 4 illustrates a block diagram of response processing for repeated cycle square wave voltammetry.

Referring to FIG. 4, in an embodiment, a diagram representing the operations involved is illustrated. It is drawn as a discrete-time Digital Signal Processing (DSP) block diagram, familiar to practitioners of DSP. The numeric flow illustrated comprises separate paths for the positive and negative half-cycle responses to each square wave, each path incorporating an identical average computation. Persons skilled in the art will recognize that identical numerical results may be obtained using other processing diagrams which are within the scope of this disclosure.

The averaging blocks in FIG. 4 operate on discrete time data and may be considered as digital filters of the Finite Impulse Response (FIR) type. In many embodiments, the filter weights are chosen to create a "low-pass" frequency response. The subsequent differencing operation has the effect of interleaving both sets of filter coefficients while flipping their signs. The resulting aggregate filter has double the sample rate and a "high-pass" frequency response whose passband is centered at the modulation frequency, $f_{mod}$. It is guaranteed to completely remove the "background" current (averaged across the positive and negative half cycles), while passing the desired difference current. Moreover, careful choice of the filter lengths (repeat count) and the weighting coefficients can result in a frequency response "null" that suppresses any interference occurring at the AC line frequency, $f_{line}$.

Figure 5:
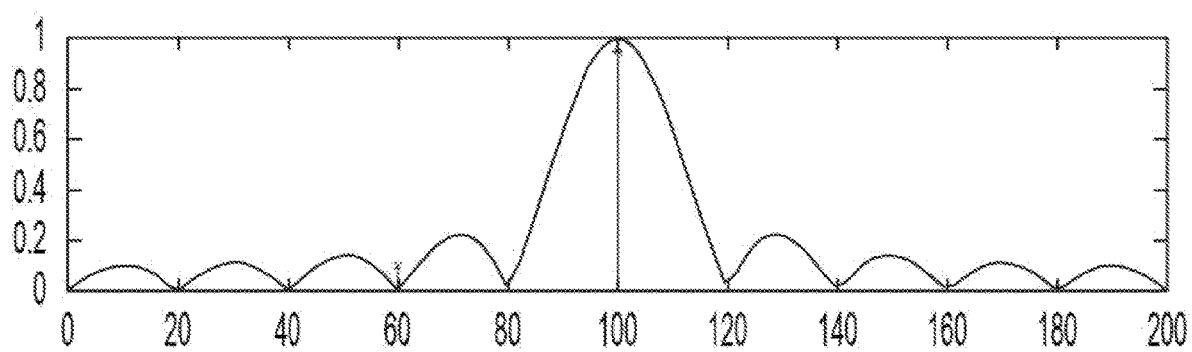
FIG. 5 illustrates an example magnitude response for uniformly-weighted averaging filters of length r=5, centered at $f_{mod}$=100 Hz, and showing response nulls at DC, $f_{line}$=60 Hz, and also at the second and third harmonics of $f_{line}$.

Referring to FIG. 5, in an embodiment, a resultant magnitude response from a pair of averaging filters each having length 5 and uniform weighting is illustrated. The horizontal axis is frequency in Hertz (Hz). When operated at $f_{mod}$=100 Hz, the filters exhibit nulls at 60 Hz, 120 Hz, and 180 Hz, and so reject the first three harmonics of $f_{line}$=60 Hz. The desired differential response signal at $f_{mod}$ marked with '*' and the AC line fundamental (shown with non-zero amplitude only for clarity) is marked with 'x'. This example illustrates how even a very simple case of Repeated Cycle SWV can be superior to a conventional SWV measurement. With conventional SWV, the choice $f_{mod}$=100 Hz is disallowed in the United States because it provides no immunity against contamination from the AC power line. The highest permissible modulation frequency for conventional SWV is $f_{mod}$=30 Hz in the United States. More generally, it is one-half of the local AC power frequency. In contrast, a user of Repeated Cycle SWV can employ very high modulation frequencies and still maintain power line immunity by using an appropriate number of repeat cycles.

Figure 6A:
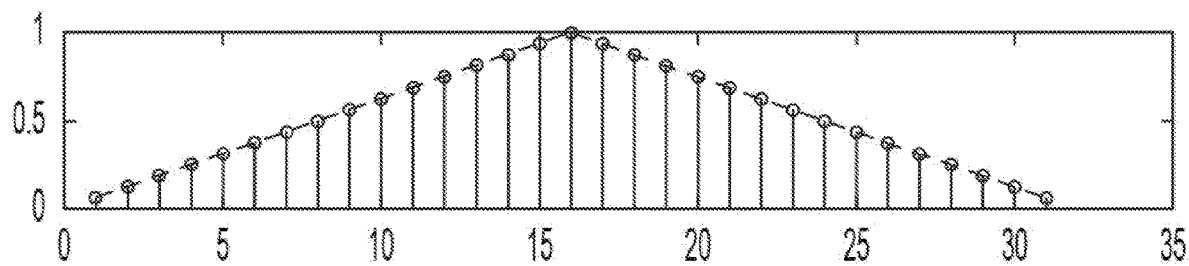
FIG. 6A illustrates an example of non-uniform weightings for repeat cycle averaging.
Figure 6B:
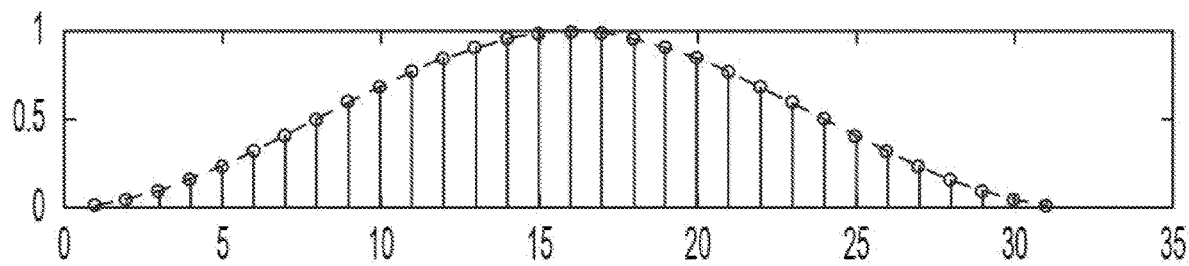
FIG. 6B illustrates another example of non-uniform weightings for repeat cycle averaging.
Figure 6C:
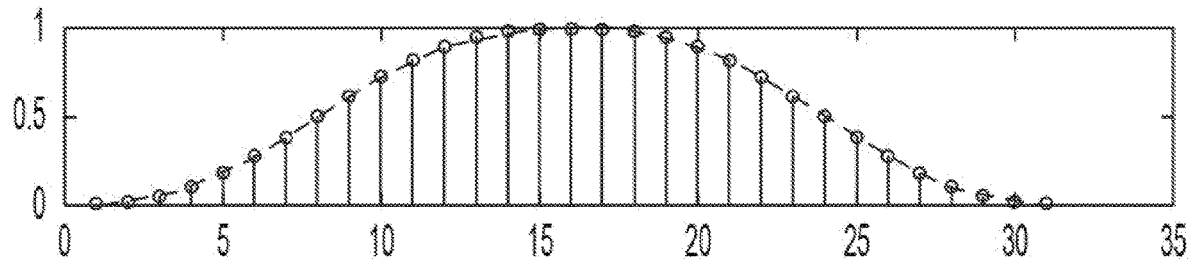
FIG. 6C illustrates a further example of non-uniform weightings for repeat cycle averaging.
Figure 7:
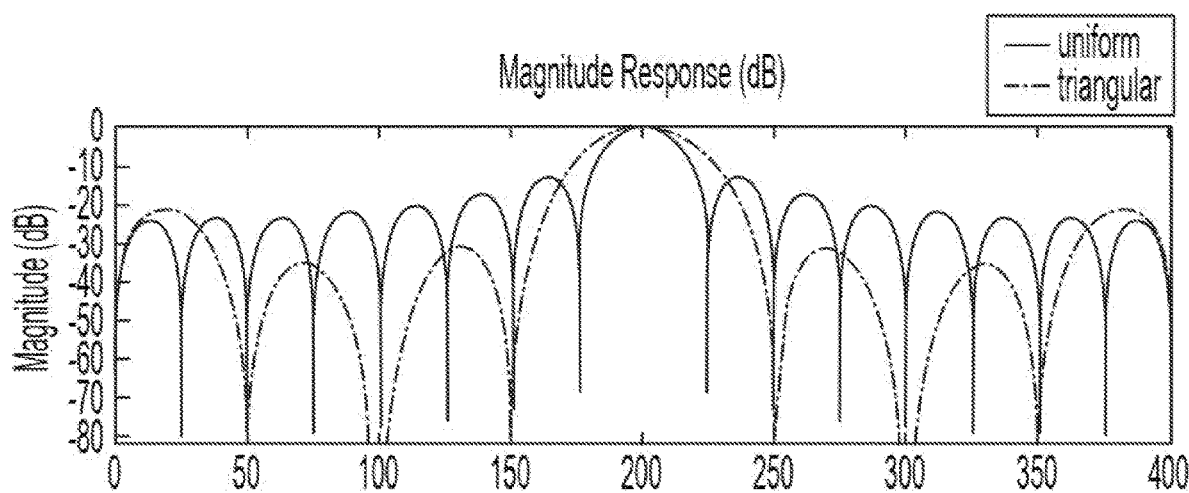
FIG. 7 illustrates example magnitude responses for uniform and triangular averaging of 8 repeats at $f_{mod}$=200 Hz.

Non-uniformly weighted averaging of the repeated square wave responses provides additional benefits, as will now be demonstrated by several examples. Referring to FIG. 6A, FIG. 6B, and FIG. 6C, in an embodiment, some possible weighting shapes for a measurement setup using 31 repeat cycles are illustrated. The triangular weighting shown in the top graph offers an advantage over uniform weighting that is easy to explain. The magnitude plot of FIG. 5 is recognizable to those skilled in the art as having a sin(f)/f or "sinc" characteristic which includes equally spaced nulls between sidelobes whose peaks decrease at a linear rate on either side of the main lobe. It is a preferred embodiment, the $f_{mod}$ and r may be chosen to place one of the nulls at $f_{line}$. When the number of repeats is increased, the nulls occur closer together and they also become narrower. It may eventually happen that the nulls become so narrow that ordinary variations in the power line frequency may cause line interference to be incompletely cancelled. To combat this problem, triangularly weighted averaging may be used. FIG. 7 compares the effects of triangular and uniform averaging of 8 repeat counts at $f_{mod}$=200 Hz. The differences are more easily seen with logarithmic scaling, so magnitude has been plotted in decibels. It is evident that triangular weighting creates fewer nulls, but wider ones. This triangular setup, with wide notches at 50 Hz, 100 Hz, and 150 Hz, would be appropriate for use in any country with a 50 Hz nominal line frequency and maintains at least 60 dB of line rejection even with a 1.5% line frequency error and more than 50 dB with a 5% error.

Figure 8:
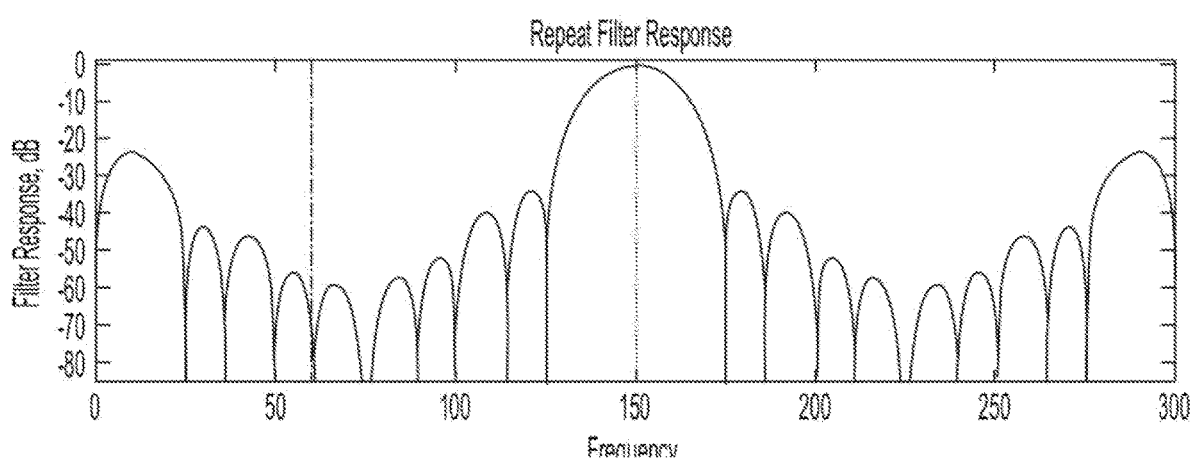
FIG. 8 illustrates an example frequency response for a sweep with 11 repeats at $f_{mod}$=150 Hz, using a more sophisticated averaging profile.

Referring to FIG. 8, in an embodiment, an effect of a weighting function similar to the example of FIG. 6B but with 11 repeat cycles is illustrated. When used with a modulation frequency of 150 Hz, these weights provide a complete null at 50 Hz, and the 60 Hz attenuation is more than 72 dB, making this measurement protocol usable in both the United States and United Kingdom. The exact weights used in this example may be adjusted, because the design of averaging weights to meet any particular criterion may be performed by a FIR (finite impulse response) filter design. Any set of weighting coefficients, however derived, is within the scope of this disclosure.

Figure 9:
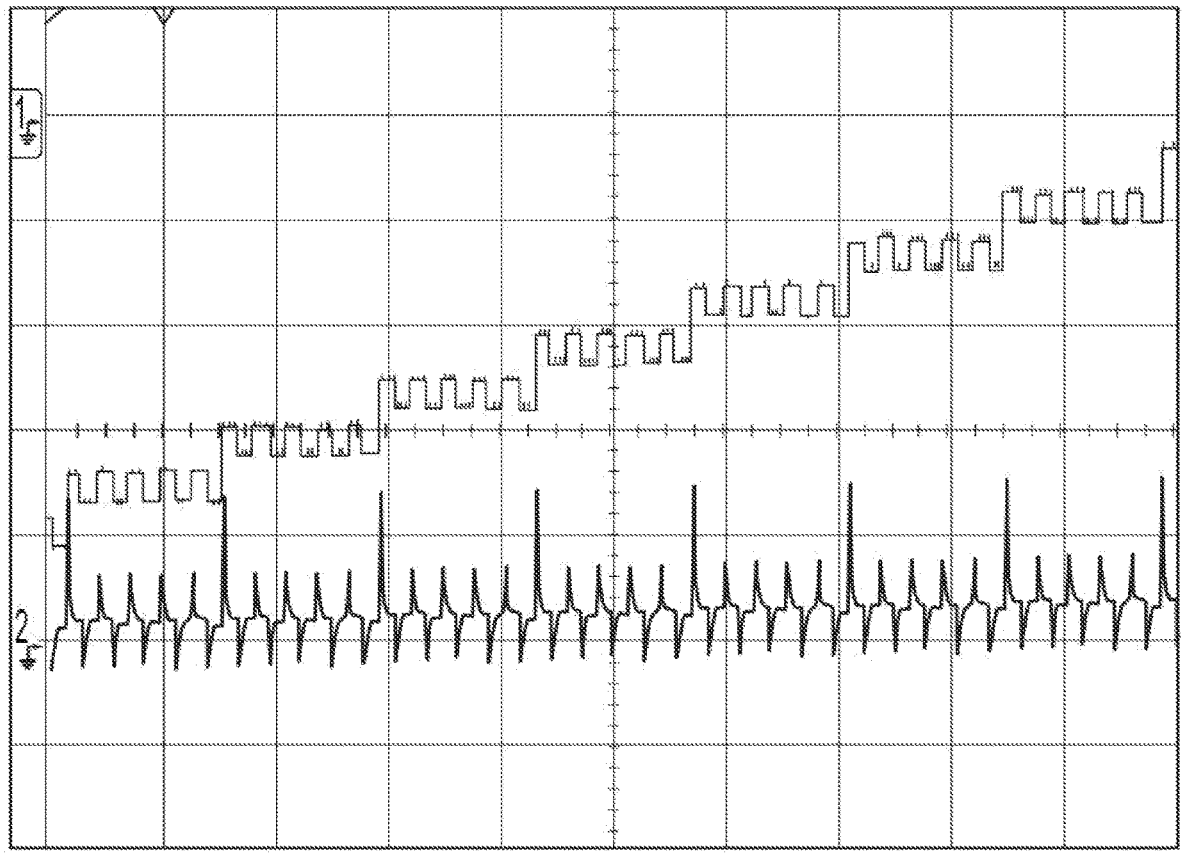
FIG. 9 illustrates an example oscilloscope capture showing stimulus and response for 5 repeats at $f_{mod}$=100 Hz. Due to the large ramp steps, the first repeat cycle in each group is atypical and may be excluded from averaging.

In an embodiment, the voltage change between ramp steps is significantly larger than the square wave amplitude as illustrated in FIG. 9 in an oscilloscope capture of such a case. It will be noted that the first current response in each repeat group is atypical, being much larger than the rest. If the repeats in each group are averaged, the response from the first repeat will be unduly weighted and the resulting filter response may be different than intended. Therefore, it is another aspect of this disclosure to provide the first repeat in each group may be excluded from the computed averages. If this were done for the case of FIG. 9, then only the last four repeat cycles from each group would be averaged, and the resulting frequency response would be the same as for the case of FIG. 5. To achieve this result, an instrument may provide an explicit "skip first" option. Alternatively, the same result may be obtained by setting the first weighting coefficient to zero.

Figure 10:
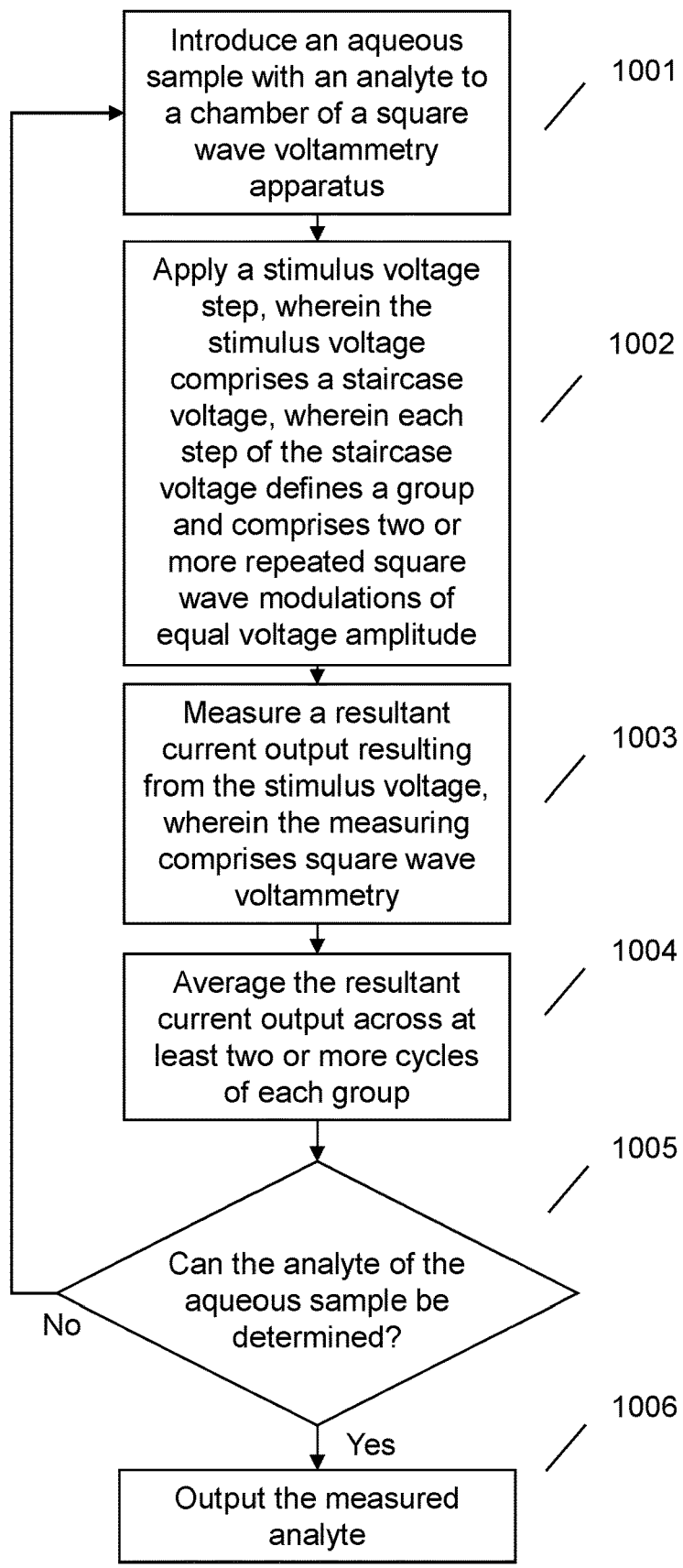
FIG. 10 illustrates flow diagram of measuring a component in an aqueous sample using square wave voltammetry.

Referring to FIG. 10, an embodiment may measure an analyte of a sample. The analyte may be any ion, component, or characteristic of the sample. At 1001, in an embodiment, an aqueous sample may be introduced into a sample chamber or region. The aqueous sample may be placed or introduced into a test chamber manually by a user or using a mechanical means, for example, gravity flow, a pump, pressure, fluid flow, or the like. For example, a water sample for testing may be introduced to a chamber by a pump. In an embodiment, there may be one or more chambers in which the one or more method steps may be performed. In an embodiment, valves or the like may control the influx and efflux of the aqueous solution into or out of the one or more chambers, if present. Once the sample is introduced to the measurement system, the system may measure the analyte or characteristic of the sample.

At 1002, in an embodiment, the system and method may apply a stimulus voltage step to the aqueous sample, wherein the stimulus voltage comprises a staircase voltage, wherein each step of the staircase voltage defines a group and comprises two or more repeated square wave modulations of equal or like voltage amplitude. At 1003, in an embodiment, the system and method may measure a resultant current output resulting from the stimulus voltage, wherein the measuring comprises square wave voltammetry. At 1004, in an embodiment, the system and method may average the resultant current output across at least two or more cycles of each group. Further details and structures related to the step are described herein.

The combination of stairstep treads and additive square wave modulations, defining a complete voltage excitation waveform, may be referred to as an electrical signal. The electrical signal may be applied using one or more electrodes, for example, a series of electrodes. Electrodes may include a working electrode, counter (auxiliary) electrode, reference electrode, or the like. In an embodiment, the electrode may comprise a pH sensitive voltammetric electrode. In an embodiment, the one or more series of electrodes may be boron doped diamond (BDD) electrodes. Other electrode material are disclosed and contemplated. The use of BDD may serve as a better electrode material than other carbon-based or metallic materials (e.g., silver, gold, mercury, nickel, etc.) because these materials may eventually themselves become oxidized, thereby generating interfering signals and contributing to the errors in a measurement. The one or more electrode may be operatively coupled to electrical circuitry described herein and/or to any square wave voltammetry circuitry. Such circuitry may allow for delivery of voltage protocols, receiving current responses, data collection, filtering, weighting, averaging, storage, output, or the like.

In an embodiment, the electrodes may be fully or at least partially disposed in the volume of aqueous solution or sample. For example, if the aqueous solution is introduced into a chamber having one or more electrodes, the aqueous solution may at least partially cover the one or more electrodes. As another example, the one or more electrodes may be partially disposed within the chamber with the other portion of the electrode outside the chamber. Thus, when the aqueous solution is introduced into the chamber it only covers the portion of the electrodes that are within the chamber.

The method and system, at 1005, may determine an analyte, analyte concentration, or characteristic of the sample. This determination may be made based upon previous voltage steps and resultant current from the method or system.

If, however, the analyte or characteristic may be determined at 1005, the system, at 1006, may output a characteristic, ionic concentration of an analyte, or the like of the aqueous sample. In an embodiment, an output may be in the form of a display, storing the data to a memory device, sending the output through a connected or wireless system, printing the output, or the like. The system may be automated, meaning the system may automatically output a result. The system may also have associated alarms, limits, or predetermined thresholds. For example, if a measured value reaches a threshold, the system may trigger an alarm, alert the system/personnel to a fault, alter the flow of the aqueous solution, or the like. Data may be analyzed in real-time, stored for later use, or any combination thereof.

In an embodiment, the stair case voltages may be controlled in real time by a processor. In an embodiment, the square wave modulation amplitude may be set in advance. In an embodiment, the timing of each cycle may be controlled by a "hardware state machine" rather than each edge being under direct control of the processor. Alternatively, some or all of the processing may be done using dedicated logic circuitry comprising a hardware state machine. These parameters may be controlled by a user, a set program, circuitry, processor, or the like. In an embodiment, in addition to the other hardware disclosed, primary interfaces between and processor and other elements may be I2C, SPI, and RS-485. These may be local serial buses and/or a serial field bus used between a measurement instrument and an external computer, which may include USB support.

The various embodiments described herein thus represent a technical improvement to conventional methods and instrument for square wave voltammetry. Using the techniques as described herein, an embodiment may use a method and device for an instrument for analyte measurement using square wave voltammetry. This is in contrast to conventional methods with limitations mentioned above. Such techniques provide a better method to construct and an instrument for analyte measurement using square wave voltammetry.

Figure 11:
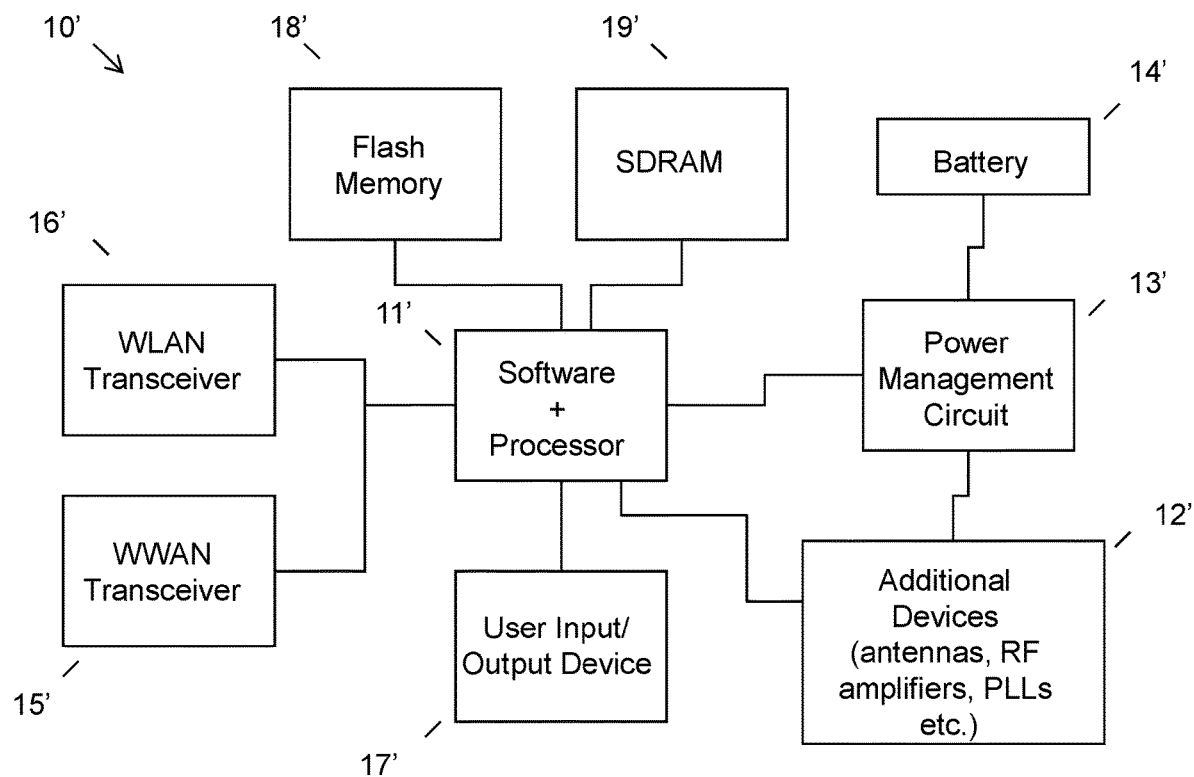
FIG. 11 illustrates an example of computer circuitry.

While various other circuits, circuitry or components may be utilized in information handling devices, with regard to an instrument for analyte measurement using square wave voltammetry according to any one of the various embodiments described herein, an example is illustrated in FIG. 11. Device circuitry 10' may include a measurement system on a chip design found, for example, a particular computing platform (e.g., mobile computing, desktop computing, etc.) Software and processor(s) are combined in a single chip 11'. Processors comprise internal arithmetic units, registers, cache memory, busses, I/O ports, etc., as is well known in the art. Internal busses and the like depend on different vendors, but essentially all the peripheral devices (12') may attach to a single chip 11'. The circuitry 10' combines the processor, memory control, and I/O controller hub all into a single chip 11'. Also, systems 10' of this type do not typically use SATA or PCI or LPC. Common interfaces, for example, include SDIO and I2C.

There are power management chip(s) 13', e.g., a battery management unit, BMU, which manage power as supplied, for example, via a rechargeable battery 14', which may be recharged by a connection to a power source (not shown). In at least one design, a single chip, such as 11', is used to supply BIOS like functionality and DRAM memory.

System 10' typically includes one or more of a WWAN transceiver 15' and a WLAN transceiver 16' for connecting to various networks, such as telecommunications networks and wireless Internet devices, e.g., access points. Additionally, devices 12' are commonly included, e.g., a transmit and receive antenna, oscillators, PLLs, etc. System 10' includes input/output devices 17' for data input and display/rendering (e.g., a computing location located away from the single beam system that is easily accessible by a user). System 10' also typically includes various memory devices, for example flash memory 18' and SDRAM 19'.

It can be appreciated from the foregoing that electronic components of one or more systems or devices may include, but are not limited to, at least one processing unit, a memory, and a communication bus or communication means that couples various components including the memory to the processing unit(s). A system or device may include or have access to a variety of device readable media. System memory may include device readable storage media in the form of volatile and/or nonvolatile memory such as read only memory (ROM) and/or random access memory (RAM). By way of example, and not limitation, system memory may also include an operating system, application programs, other program modules, and program data. The disclosed system may be used in an embodiment of an instrument for square wave voltammetry.

As will be appreciated by one skilled in the art, various aspects may be embodied as a system, method or device program product. Accordingly, aspects may take the form of an entirely hardware embodiment or an embodiment including software that may all generally be referred to herein as a "circuit," "module" or "system." Furthermore, aspects may take the form of a device program product embodied in one or more device readable medium(s) having device readable program code embodied therewith.

It should be noted that the various functions described herein may be implemented using instructions stored on a device readable storage medium such as a non-signal storage device, where the instructions are executed by a processor. In the context of this document, a storage device is not a signal and "non-transitory" includes all media except signal media.

Program code for carrying out operations may be written in any combination of one or more programming languages. The program code may execute entirely on a single device, partly on a single device, as a stand-alone software package, partly on single device and partly on another device, or entirely on the other device. In some cases, the devices may be connected through any type of connection or network, including a local area network (LAN) or a wide area network (WAN), or the connection may be made through other devices (for example, through the Internet using an Internet Service Provider), through wireless connections, e.g., near-field communication, or through a hard wire connection, such as over a USB connection.

Example embodiments are described herein with reference to the figures, which illustrate example methods, devices and products according to various example embodiments. It will be understood that the actions and functionality may be implemented at least in part by program instructions. These program instructions may be provided to a processor of a device, e.g., a measurement device such as illustrated in FIG. 11, or other programmable data processing device to produce a machine, such that the instructions, which execute via a processor of the device, implement the functions/acts specified.

It is noted that the values provided herein are to be construed to include equivalent values as indicated by use of the term "about." The equivalent values will be evident to those having ordinary skill in the art, but at the least include values obtained by ordinary rounding of the last significant digit.

This disclosure has been presented for purposes of illustration and description but is not intended to be exhaustive or limiting. Many modifications and variations will be apparent to those of ordinary skill in the art. The example embodiments were chosen and described in order to explain principles and practical application, and to enable others of ordinary skill in the art to understand the disclosure for various embodiments with various modifications as are suited to the particular use contemplated.

Thus, although illustrative example embodiments have been described herein with reference to the accompanying figures, it is to be understood that this description is not limiting and that various other changes and modifications may be affected therein by one skilled in the art without departing from the scope or spirit of the disclosure.

What is claimed is:

1. A method for measuring a component of an aqueous sample using square wave voltammetry, comprising:
    introducing the aqueous sample to a chamber of a square wave voltammetry apparatus;
    applying a stimulus voltage step to the aqueous sample, wherein the stimulus voltage comprises a staircase voltage, wherein each step of the staircase voltage defines a group and comprises two or more repeated square wave modulations of equal voltage amplitude to the same voltage;
    measuring a resultant current output resulting from the stimulus voltage, wherein the measuring comprises square wave voltammetry; and
    averaging the resultant current output across the two or more repeated square wave modulations of the group, wherein the averaging consists essentially of separating the resultant current output into a positive half cycle resultant current output and a negative half cycle resultant current output, each of which is passed thru a finite impulse response filter.

2. The method of claim 1, wherein the averaging comprises a uniform weighting of each group.

3. The method of claim 1, wherein the averaging comprises a non-uniform weighting of each group.

4. The method of claim 3, wherein the averaging further comprises selecting the non-uniform weighting to filter out from the resulting current output contamination due to interference from a 60 Hz signal and harmonics thereof from AC power lines.

5. The method of claim 4, wherein the non-uniform weighting results in a null at a selected response frequency that will suppress any interference from an AC line at that frequency.

6. The method of claim 5, wherein the interference frequency comprises an interference from an alternating current power supply.

7. The method of claim 3, wherein the non-uniform weighting comprises a triangular weighting.

8. The method of claim 1, wherein the period length of the averaged cycles is equal to the period length of an integer number of power source cycles in an AC power line.

9. A device for measuring a component of an aqueous sample using square wave voltammetry, comprising:
  a voltammetric electrode;
  at least one reference electrode;
  at least one counter electrode; and
  a memory storing instructions executable by a processor to:
  apply a stimulus voltage step to the aqueous sample, wherein the stimulus voltage comprises a staircase voltage, wherein each step of the staircase voltage defines a group and comprises two or more repeated square wave modulations of equal voltage amplitude;
  measure a resultant current output resulting from the stimulus voltage, wherein the measuring comprises square wave voltammetry; and
  average the resultant current output across the two or more repeated square wave modulations of the group, wherein the averaging consists essentially of separating the resultant current output into a positive half cycle resultant current output and a negative half cycle resultant current output, each of which is passed thru a finite impulse response filter.

10. The device of claim 9, wherein the averaging comprises a uniform weighting of each group.

11. The device of claim 9, wherein the averaging comprises a non-uniform weighting of each group.

12. The device of claim 11, wherein the averaging further comprises selecting the non-uniform weighting to filter out from the resulting current output contamination due to interference from a 60 Hz signal and harmonics thereof from AC power lines.

13. The device of claim 12, wherein the non-uniform weighting results in a null at a selected response frequency that will suppress any interference from an AC line at that frequency.

14. The device of claim 13, wherein the interference frequency comprises an interference from an alternating current power supply.

15. The device of claim 11, wherein the non-uniform weighting comprises a triangular weighting.

16. The device of claim 9, wherein the period length of the averaged cycles is equal to the period length of an integer number of power source cycles in an AC power line.

17. A system for measuring a component of an aqueous sample using square wave voltammetry, comprising:
  a voltammetric electrode;
  at least one reference electrode;
  at least one counter electrode; and
  a storage device having code stored therewith, the code being executable by the processor and comprising:
  code that applies a stimulus voltage step to the aqueous sample, wherein the stimulus voltage comprises a staircase voltage, wherein each step of the staircase voltage defines a group and comprises repeated square wave modulations of equal voltage amplitude;
  code that measures a resultant current output resulting from the stimulus voltage, wherein the measuring comprises square wave voltammetry; and
  code that averages the resultant current output across the two or more repeated square wave modulations of the group, wherein the averaging consists essentially of separating the resultant current output into a positive half cycle resultant current output and a negative half cycle resultant current output, each of which is passed thru a finite impulse response filter.

* * * * *